United States Patent
Chen et al.

(10) Patent No.: US 6,489,206 B2
(45) Date of Patent: Dec. 3, 2002

(54) METHOD FOR FORMING SELF-ALIGNED LOCAL-HALO METAL-OXIDE-SEMICONDUCTOR DEVICE

(75) Inventors: Tai-Ju Chen, Tainan (TW); Hua-Chou Tseng, Hsin Chu (TW)

(73) Assignee: United Microelectronics Corp. (TW)

( * ) Notice: Subject to any disclaimer, the term of this patent is extended or adjusted under 35 U.S.C. 154(b) by 0 days.

(21) Appl. No.: 09/814,411

(22) Filed: Mar. 22, 2001

(65) Prior Publication Data

US 2002/0135015 A1 Sep. 26, 2002

(51) Int. Cl.$^7$ ............................................. H01L 21/336
(52) U.S. Cl. .................... 438/300; 438/291; 438/299; 438/302; 438/305
(58) Field of Search ................... 438/299, 291, 438/300, 305, 430, 302, 303

(56) References Cited

U.S. PATENT DOCUMENTS

| | | | | |
|---|---|---|---|---|
| 5,523,245 A | * | 6/1996 | Imai | 438/348 |
| 5,693,979 A | * | 12/1997 | Sato | 438/969 |
| 5,908,313 A | * | 6/1999 | Chau et al. | 438/299 |
| 6,025,242 A | * | 2/2000 | Ma et al. | 438/303 |
| 6,087,235 A | * | 7/2000 | Yu | 438/300 |
| 6,091,117 A | * | 7/2000 | Shiozawa et al. | 257/384 |
| 6,187,642 B1 | * | 2/2001 | Yu et al. | 438/300 |
| 6,235,567 B1 | * | 5/2001 | Huang | 438/152 |
| 6,288,427 B2 | * | 9/2001 | Huang | 257/200 |
| 6,335,250 B1 | * | 1/2002 | Egi | 438/300 |
| 6,335,252 B1 | * | 1/2002 | Oishi et al. | 438/303 |

* cited by examiner

Primary Examiner—John F. Niebling
Assistant Examiner—Walter L. Lindsay, Jr.
(74) Attorney, Agent, or Firm—Powell Goldstein Frazer & Murphy LLP

(57) ABSTRACT

A method for forming a self-aligned local-halo metal-oxide-semiconductor device is provided. The present method is characterized in that a pair of first sidewall spacers is firstly formed on opposite sides of a gate electrode over a semiconductor substrate, and then a pair of second sidewall spacers is formed, each of which formed on one side of each first sidewall spacer. Next, a raised source/drain is formed upward on the substrate between each shallow trench isolation and each second sidewall spacer. Thereafter, the pair of second sidewall spacers is stripped away. Then, the gate electrode and raised source/drain act as the self-aligned ion implant masks, a LDD/Halo implantation is performed to form a local LDD/Halo diffusion region between each shallow trench isolation and each of the first sidewall spacers.

3 Claims, 4 Drawing Sheets

METHOD FOR FORMING SELF-ALIGNED LOCAL-HALO METAL-OXIDE-SEMICONDUCTOR DEVICE

BACKGROUND OF THE INVENTION

1. Field of the Invention

The present invention relates to a method for forming a raised source/drain semiconductor device, and more particularly to a method for forming a local-halo semiconductor device with raised source/drain.

2. Description of the Prior Art

As semiconductor devices are scaled to smaller dimensions, generally in the sub-0.1 $\mu$m region, it is highly desirable and generally necessary to fabricate such devices with source/drain shallow junction and a controllable halo implant region adjacent to the source/drain shallow junction to reduce short channel effects, such as subsurface punch-through and hot carrier effect. The halo implant region is a doped implanted region, which is oppositely doped to the shallow junction region. However, when a silicide is formed on the source/drain region, the silicide easily contacts with the shallow junction to make junction leakage. Therefore, an approach to resolve the leakage problem is to use raised source/drain. Since the raised source/drain is formed upward above the substrate, the silicide could not easily contact with the shallow junction, and then the junction leakage can be reduced.

FIGS. 1A to 1C shows various steps for forming a conventional N-channel metal-oxide-semiconductor (MOS) device with raised source/drain. The conventional method comprises the following steps. Firstly, referring to FIG. 1A, a P type semiconductor substrate 100 is provided. A plurality of shallow trench isolation 101 is formed in the substrate 100. Then, a gate oxide 102 and a gate electrode 103 are sequentially formed between each pair of the shallow trench isolation 101 on the substrate 100. Subsequently, placing an implant mask on the substrate 100 and by way of ion implantation, to form an N type lightly doped drain region 104 between the gate electrode 103 and each of the pair of shallow trench isolation 101 in the substrate 100. And then, performing halo implantation to form a halo implant region 105 with P type conductivity surrounding each of the lightly doped drain region 104.

Secondly, referring to FIG. 1B, forming a conformal silicon dioxide layer 106 on the gate electrode 103 and then forming a silicon nitride layer 107 on the conformal silicon dioxide layer 106. The conformal silicon dioxide layer 106 is anisotropically etched by way of reactive ion etch method to form a pair of first sidewall spacers 106 on opposite sides of the gate electrode 103 and a pair of second sidewall spacers 107 on the opposite sides of the first sidewall spacer 106.

Finally, referring to FIG. 1C, forming a raised source/drain 108 upward on each of the pair of the lightly doped drain region 104. However, there are some disadvantages existing in this conventional method. One is the halo implant region 105 surrounding the lightly doped drain region 104 increases the junction capacitance, resulting in a slower operation speed for the MOS device. The other is the misalignment of the ion implant mask can cause changeable LDD/halo implant regions.

Accordingly, it is desirable to provide a method for forming a local halo MOS device with raised source/drain to reduce the junction capacitance and also overcome the drawbacks of the conventional method.

SUMMARY OF THE INVENTION

It is an objective of the present invention to provide a method for forming a self-aligned local-halo metal-oxide-semiconductor (MOS) device with raised source/drain, in which a gate electrode and the raised source/drain act as the self-aligned masks, a LDD/halo implantation is performed to form a local LDD/halo diffusion region therebetween in the substrate. The local LDD/halo diffusion region reduces the junction capacitance. Thereby, the operation speed of the MOS device is facilitated.

Another objective of the present invention is to provide a method for forming a self-aligned local-halo metal-oxide-semiconductor (MOS) device with raised source/drain, in which a gate electrode and the raised source/drain act as self-aligned masks to form a local LDD/halo diffusion region therebetween. Therefore, an extra mask is not necessary and then the manufacturing process is simplified.

In order to achieve the above objectives, the present invention provides a method for forming a self-aligned local-halo metal-oxide-semiconductor device. At first, a semiconductor substrate with a first conductive type having a plurality of shallow trench isolation formed therein is provided. Then, sequentially forming a gate oxide and a gate electrode between each pair of the shallow trench isolations over the substrate. Next, forming a first sidewall spacer along each side of the gate electrode. And then, a second sidewall spacer is formed along one side of each first sidewall spacer. Thereafter, forming a raised source/drain upward on the substrate between each shallow trench isolation and each second sidewall spacer. Then, each second sidewall spacer is removed. Following, forming a lightly doped diffusion region with a second conductive type being opposite with the first conductive type between each raised source/drain and the gate electrode in the substrate. Finally, forming a halo diffusion region with the first conductive type surrounding the lightly doped diffusion region. By way of the present method, a local LDD/halo diffusion region with a low junction capacitance is obtained. And then, the operation speed of the MOS device is facilitated.

BRIEF DESCRIPTION OF THE DRAWINGS

The present invention can be best understood through the following description and accompanying drawings, wherein.

DESCRIPTION OF THE PREFERRED EMBODIMENTS

Figure 1A:
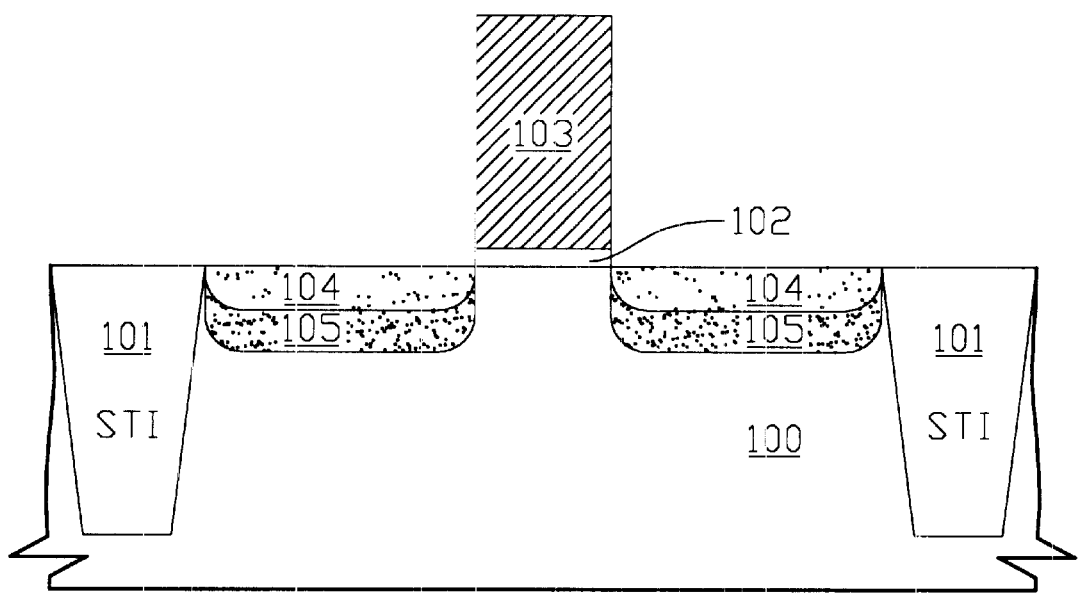
FIGS. 1A to 1C shows schematically cross-sectional views of various steps of a conventional method for forming a raised source/drain MOS device.
Figure 1B:
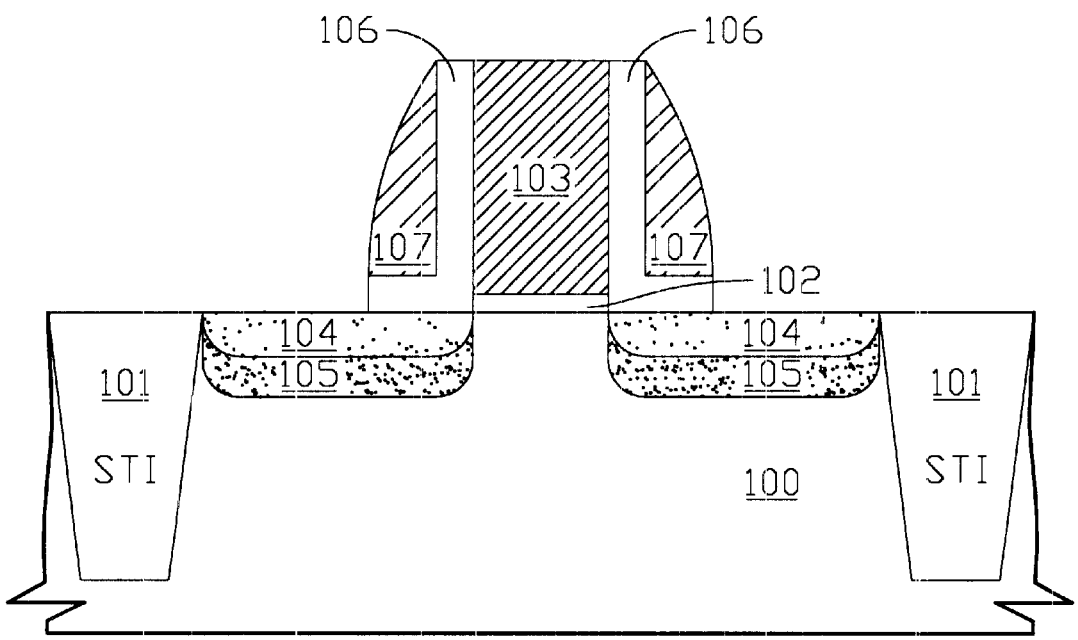
Figure 1C:
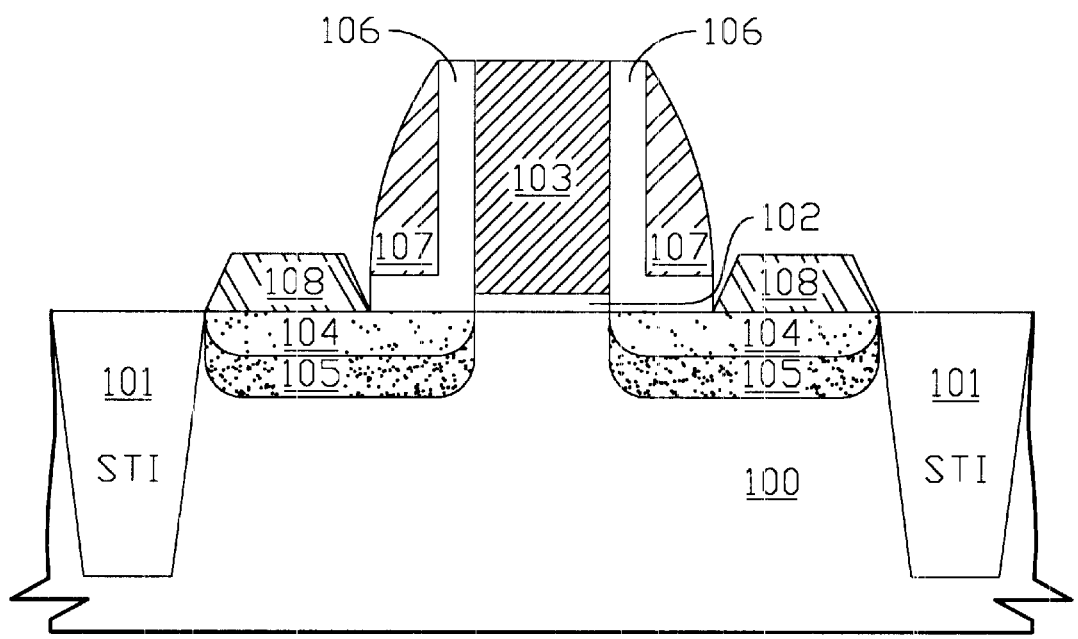
Figure 2A:
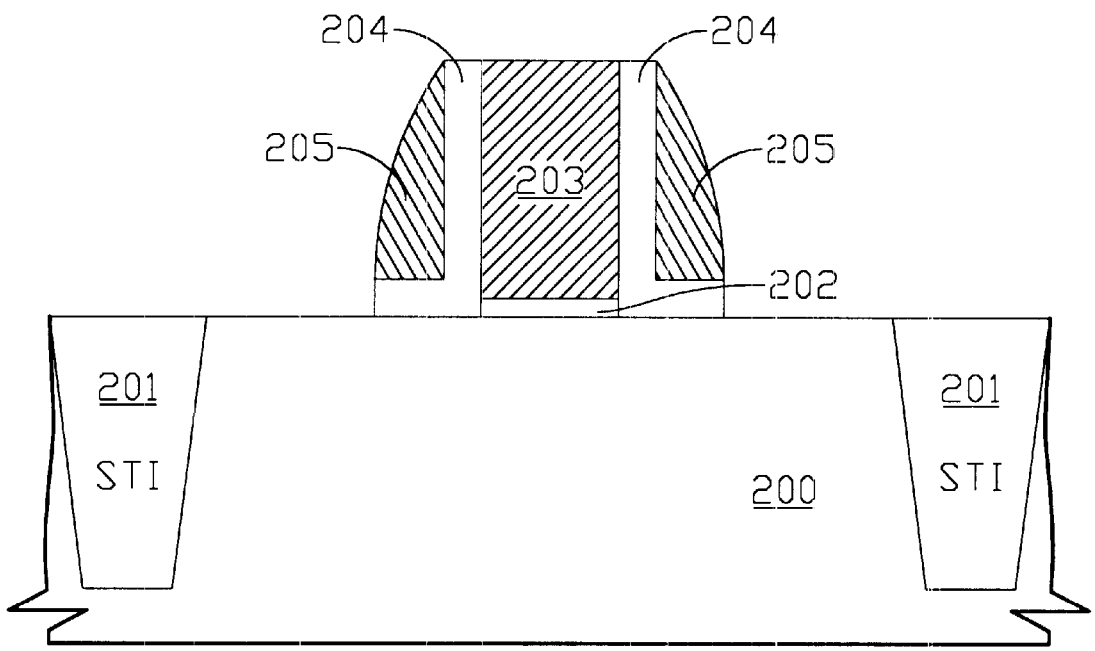
FIGS. 2A to 2D shows schematically cross-sectional views of various steps of the present method according to one embodiment of the present invention.

Referring to FIG. 2A, a semiconductor substrate 200 with a first conductive type is firstly provided. The first conductive type is either of N type and P type. A plurality of shallow trench isolation 201 is formed in the substrate 200. Then, a gate oxide 202 and a polysilicon gate electrode 203 are sequentially formed between each pair of the shallow trench isolation 201 on the substrate 200. Next, forming a pair of first sidewall spacers 204 on opposite sides of the gate electrode 203. Then, a pair of second sidewall spacers 205 is formed on opposite sides of the first sidewall spacers 204. The first sidewall spacer 204 and second sidewall spacer 205 are formed by way of the following steps: forming a conformal silicon dioxide layer 204 on the polysilicon gate electrode 203, and then forming a silicon nitride layer 205 on the conformal silicon dioxide layer 204; and anisotropically etching the conformal silicon dioxide layer 204 and the silicon nitride layer 205 with reactive ion etch method. The conformal silicon dioxide layer 204 can be formed by way of TEOS chemical vapor deposition method. The silicon nitride layer 205 can be formed by way of LPCVD method utilizing $SiH_2Cl_2$ and $NH_3$ as reaction gases at the temperature of about 700~800° C. and the operational pressure about 0.1~1 torr. Alternately, the silicon nitride layer 205 can be formed by way of PECVD method utilizing $SiH_4$, $NH_3$ and $N_2$ as reaction gases at the temperature of about 250~400° C. and the operational pressure about 1~5 torr.

Figure 2B:
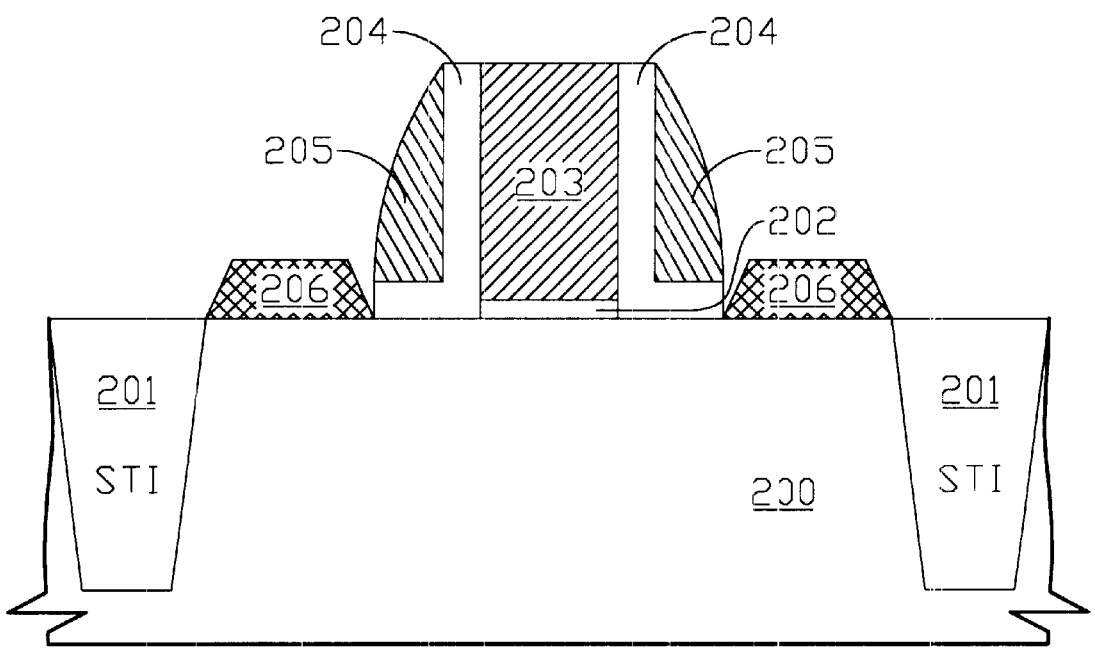

Subsequently, referring to FIG. 2B, forming a pair of raised source/drain 206 upward on the substrate 200 with a thickness about 400~1000 angstroms, each of which formed between each shallow trench isolation 201 and each second sidewall spacer 205. The raised source/drain 206 can be formed of selective epitaxial growth (SEG) semiconductor material, such as silicon and silicon germanium alloy, by way of ultra-high vacuum chemical vapor deposition (UHVCVD) method.

Figure 2C:
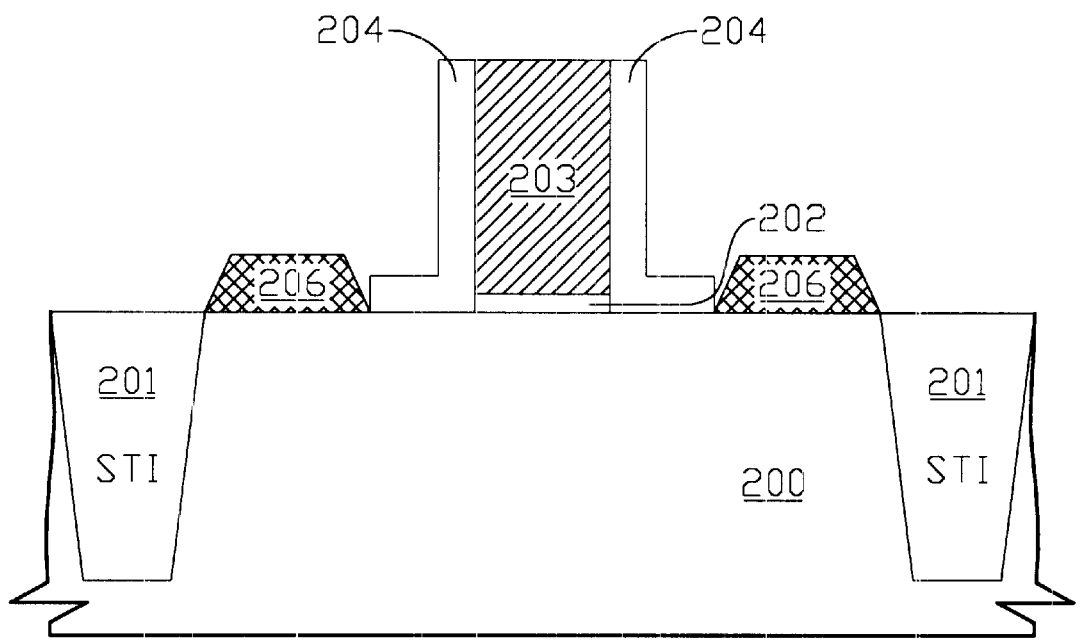

Referring to FIG. 2C, thereafter, the second sidewall spacers 205 of silicon nitride are stripped away by way of wet etching with $H_3PO_4$ aqueous solution.

Figure 2D:
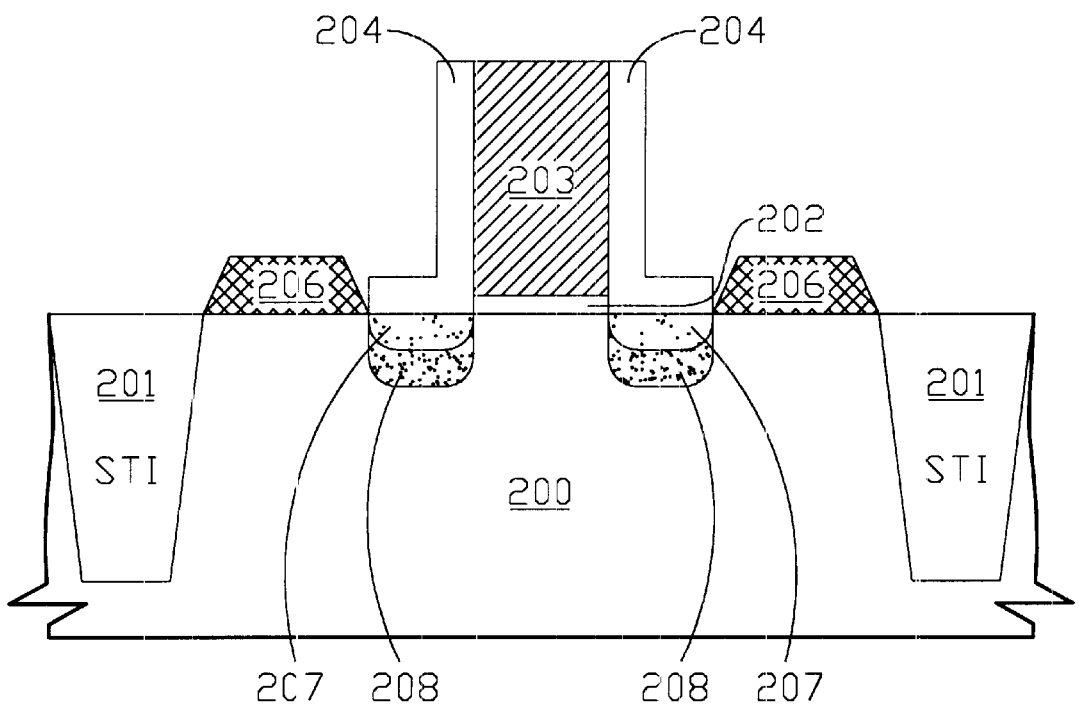

Following, referring to FIG. 2D, the gate electrode 203 and raised source/drain 206 are used to act as self-aligned ion implant masks. When the substrate 200 has P type conductivity, a lightly doped diffusion region 207 with N type impurity is firstly formed in the substrate 200 between the gate electrode 203 and each of the raised source/drain 206. The lightly doped diffusion region 207 can be formed under the following conditions: arsenic ion is implanted with an implantation energy of 5 to 15 Kev at an implantation dose of $5 \times 10^{13}$ to $5 \times 10^{15}$ ions/cm$^2$. Thereafter, a halo implantation is performed to form a halo diffusion region with P type conductivity 208 surrounding each of the lightly doped diffusion regions 207. The halo implantation is carried out under the following conditions: boron ion is implanted with an implantation energy of 15 to 25 Kev at an implantation dose of $1 \times 10^{13}$ to $5 \times 10^{14}$ ions/cm$^2$. $BF_2^+$ ion can be substituted for boron ion, with an implantation energy of about 30 Kev to 40 Kev at an implantation dose of of $1 \times 10^{13}$ to $5 \times 10^{14}$ ions/cm$^2$.

Accordingly, a self-aligned local-halo N-channel MOS device with raised source/drain is obtained.

When the substrate 200 has N type conductivity, the lightly doped diffusion region 207 can be formed under the following conditions: boron ion is implanted with an implantation energy of 5 to 15 Kev at an implantation dose of $5 \times 10^{13}$ to $5 \times 10^{15}$ ions/cm$^2$. Thereafter, a halo implantation is performed to form a halo diffusion region with N type conductivity 208 surrounding each of the lightly doped diffusion regions 207. The halo implantation is carried out under the following conditions: arsenic ion is implanted with an implantation energy of 130 to 150 Kev at an implantation dose of $1 \times 10^{13}$ to $5 \times 10^{14}$ ions/cm$^2$. Thereby, a self-aligned local-halo P-channel MOS device with raised source/drain is provided.

In accordance with the present invention, the local-halo region reduces the junction capacitance to facilitate the operational speed of the MOS device. The gate electrode 203 and raised source/drain 206 act as the self-aligned ion implant masks so as to save an extra mask and the process of the present invention is simplified.

The preferred embodiments are only used to illustrate the present invention, not intended to limit the scope thereof. Many modifications of the preferred embodiments can be made without departing from the spirit of the present invention.

What is claimed is:

1. A method for forming a self-aligned local-halo metal-oxide-semiconductor device, comprising:

providing a semiconductor substrate with a first conductive type having a plurality of shallow trench isolation formed therein;

sequentially forming a gate oxide and a gate electrode between each pair of said shallow trench isolation over said substrate;

forming a first sidewall spacer along each side of said gate electrode;

forming a second sidewall spacer along one side of each said first sidewall spacer;

performing a ultra-high vacuum chemical vapor deposition (UHVCVD) method to form a raised source/drain of selective epitaxial growth (SEG) silicon upward on said substrate between each said shallow trench isolation and each said second sidewall spacer;

removing each said second sidewall spacer;

forming a lightly doped diffusion region with a second conductive type being opposite with said first conductive type between each said raised source/drain and said gate electrode in said substrate; and forming a halo diffusion region with said first conductive type surrounding said lightly doped diffusion region.

2. A method for forming a self-aligned local-halo metal-oxide-semiconductor device, comprising:

providing a semiconductor substrate with a first conductive type having a plurality of shallow trench isolation formed therein;

sequentially forming a gate oxide and a gate electrode between each pair of said shallow trench isolation over said substrate;

forming a first sidewall spacer along each side of said gate electrode;

forming a second sidewall spacer along one side of each said first sidewall spacer;

performing a ultra-high vacuum chemical vapor deposition (UHVCVD) method to form a raised source/drain of selective epitaxial growth (SEG) silicon germanium alloy upward on said substrate between each said shallow trench isolation and each said second sidewall spacer;

removing each said second sidewall spacer;

forming a lightly doped diffusion region with a second conductive type being opposite with said first conductive type between each said raised source/drain and said gate electrode in said substrate; and forming a halo diffusion region with said first conductive type surrounding said lightly doped diffusion region.

3. A method for forming a self-aligned local-halo metal-oxide-semiconductor device with raised source/drain, comprising:

providing a semiconductor substrate with a first conductive type having a plurality of shallow trench isolation formed therein;

sequentially forming a gate oxide and a gate electrode between each pair of said shallow trench isolation over said substrate;

forming a sidewall spacer of silicon dioxide along each side of said gate electrode;

forming a sidewall spacer of silicon nitride along one side of each said sidewall spacer of silicon dioxide;

performing ultra-high vacuum chemical vapor deposition method to form a raised source/drain of selective epitaxial growth semiconductor material upward on said substrate between each said shallow trench isolation and each said sidewall spacer of silicon nitride;

removing each said sidewall spacer of silicon nitride;

forming a lightly doped diffusion region with a second conductive type being opposite with said first conductive type between each said raised source/drain and said gate electrode in said substrate; and forming a halo diffusion region with said first conductive type surrounding each said lightly doped diffusion region.

* * * * *